United States Patent [19]
Agnew et al.

[11] Patent Number: 5,822,442
[45] Date of Patent: Oct. 13, 1998

[54] GAIN COMPRESSION AMPLFIER PROVIDING A LINEAR COMPRESSION FUNCTION

[75] Inventors: Jeremy A. Agnew, Colorado Springs; Jerry R. Wahl, Woodland Park, both of Colo.

[73] Assignee: Starkey Labs, Inc., Eden Prairie, Minn.

[21] Appl. No.: 526,806

[22] Filed: Sep. 11, 1995

[51] Int. Cl.[6] ................................................. H03G 3/00
[52] U.S. Cl. .................... 381/107; 381/106; 381/68.4; 333/14; 330/278
[58] Field of Search ..................... 381/106, 107, 381/108, 68.2, 68.4, 120; 333/14; 341/139; 330/278, 254, 260, 261; 455/72

[56] References Cited

U.S. PATENT DOCUMENTS

| | | |
|---|---|---|
| 4,471,171 | 9/1984 | Köpke et al. . |
| 4,475,230 | 10/1984 | Fukuyama et al. . |
| 4,630,302 | 12/1986 | Kryter ........................................ 381/57 |
| 4,661,981 | 4/1987 | Henrickson et al. . |
| 4,683,449 | 7/1987 | Kato ..................................... 381/106 |
| 4,718,099 | 1/1988 | Hotvet ................................... 381/68.4 |
| 4,731,850 | 3/1988 | Levitt et al. . |
| 4,754,230 | 6/1988 | Schwartz et al. ......................... 333/14 |
| 4,759,071 | 7/1988 | Heide ..................................... 381/106 |
| 4,791,672 | 12/1988 | Nunley et al. . |
| 4,792,977 | 12/1988 | Anderson et al. . |
| 4,868,517 | 9/1989 | Waldhauer et al. . |
| 4,882,762 | 11/1989 | Waldhauer . |
| 4,989,251 | 1/1991 | Mangold . |
| 4,996,712 | 2/1991 | Laurence et al. . |
| 5,046,103 | 9/1991 | Warnaka et al. . |
| 5,111,506 | 5/1992 | Charpentier et al. . |
| 5,131,046 | 7/1992 | Killion et al. ......................... 381/68.2 |
| 5,202,927 | 4/1993 | Topholm . |
| 5,259,033 | 11/1993 | Goodings et al. . |
| 5,276,739 | 1/1994 | Krokstad et al. . |
| 5,278,912 | 1/1994 | Waldhauer . |
| 5,289,529 | 2/1994 | Karnowski ............................. 381/106 |
| 5,396,560 | 3/1995 | Arcos et al. . |
| 5,406,633 | 4/1995 | Miller et al. . |
| 5,528,695 | 6/1996 | Klippel ................................... 381/106 |

OTHER PUBLICATIONS

"Understanding Digitally Programmable Hearing Aids" edited by R.E. Sandlin, Chapter 2, pp. 15, 28 and 31 (1994).

*Primary Examiner*—Vivian Chang
*Attorney, Agent, or Firm*—Jay H. Maioli

[57] ABSTRACT

An amplifier uses gain compression techniques to provide linear gain control over a wide dynamic range, and includes an amplifier having input and output legs, a gain controller coupled between the input and output legs of the amplifier, a gain control circuit having an input coupled to the amplifier output leg and output coupled to the gain controller. The gain controller is responsive to a gain control signal to permit continuous gain adjustment of the amplifier. The gain control circuit is configured to compare an output voltage on the amplifier output leg with a predetermined threshold voltage and to generate a gain control signal on the gain control circuit output so as to provide continuous gain adjustment of the amplifier at least when the amplifier output voltage is greater than the threshold voltage. A hearing aid using a single compression amplifier or multiple compression amplifiers to minimize sound distortion and enhance user comfort is also provided.

22 Claims, 9 Drawing Sheets

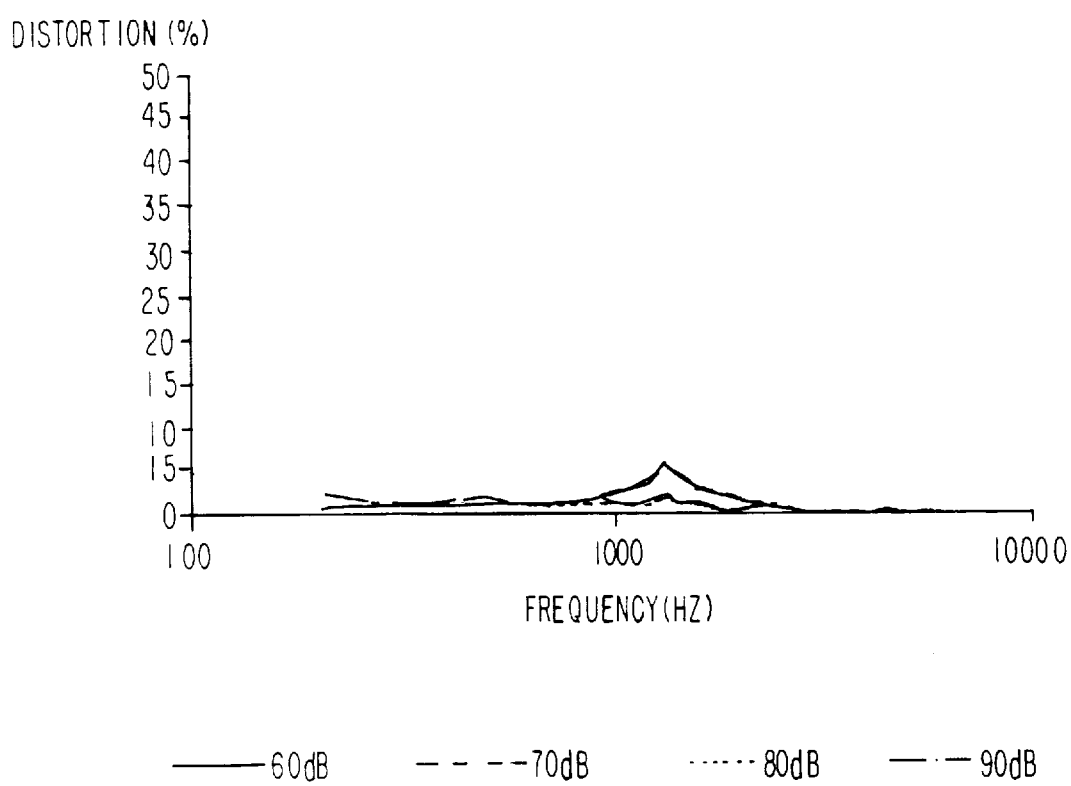

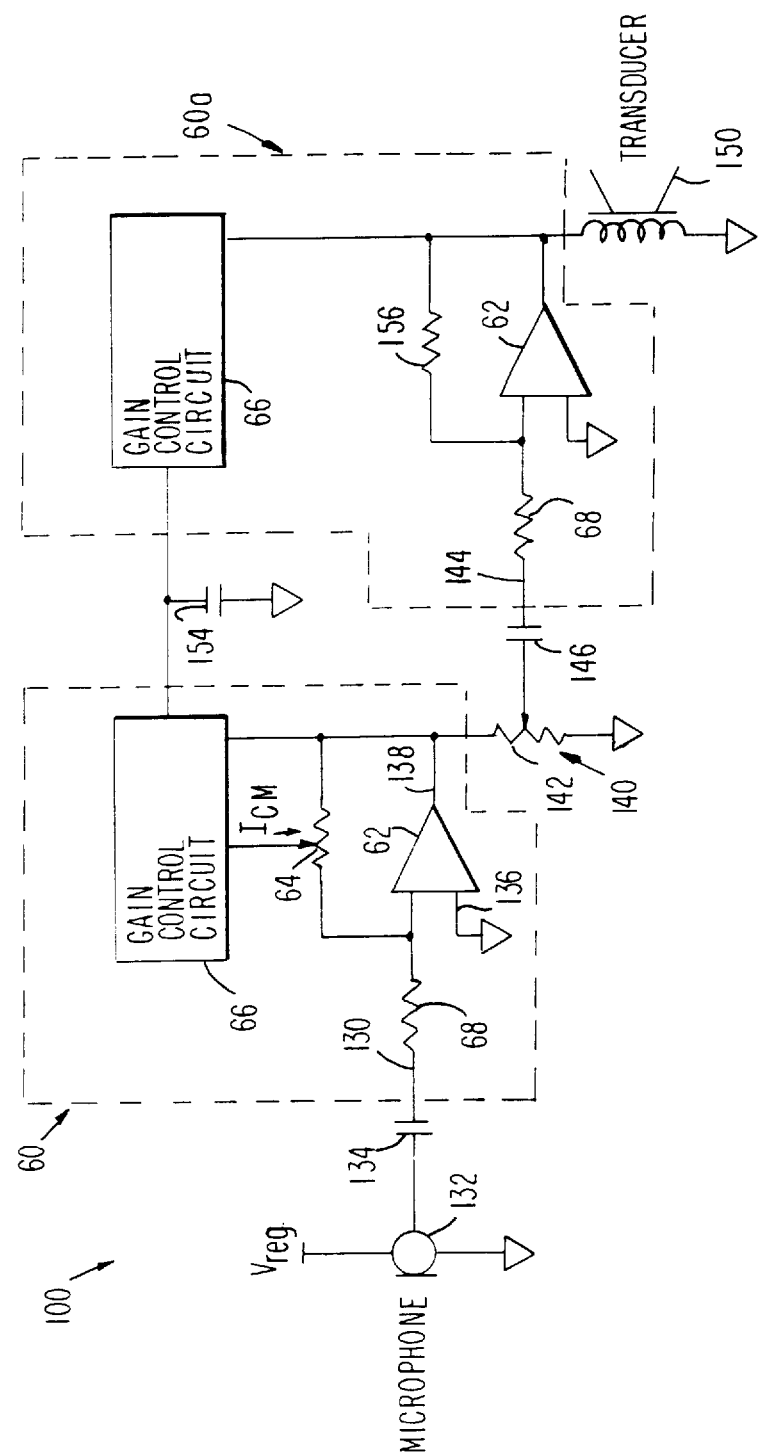

GAIN COMPRESSION AMPLIFIER PROVIDING A LINEAR COMPRESSION FUNCTION

BACKGROUND

1. Field of the Invention

The present invention relates to gain compression amplifiers that provide a linear compression function. More particularly, the present invention provides a gain compression amplifier having a linear compression function over a wide dynamic range for use in hearing aids.

2. Description of the Related Art

Distortion in the hearing aid art is defined as the generation of added undesired sounds in the output signal that are not present in the input signal. It is believed that such distortion, that is, these additional sounds, act as a type of masking noise for speech, both by direct masking of low-level speech cues that fill in the temporal structure of speech sounds and by degrading important amplitude cues. Peakclipping has been used as a technique for limiting the amplitude of the output stage of a standard hearing aid, however, the peak-clipping technique often creates distortions in the output stage of the hearing aid circuitry.

For the purposes of sound distortion analysis, a hearing aid can generally be considered to consist of two primary amplifying stages, a preamplifier stage and an output amplifier stage. FIG. 1 shows an exemplary configuration of a two-stage hearing aid 10. As seen in FIG. 1, the preamplifier stage 12 of hearing aid 10 includes an amplifier 14 having one input 16 connected to a microphone 18 via coupling capacitor 20 and another input 22 connected to ground. The amplifier 14 has a fixed gain which is set by resistors 24 and 26. The output 28 of the preamplifier stage 12 is connected to a user adjustable volume control circuit 30 having an output 32 connected to the output stage 34 of the hearing aid 10. The volume control circuit 30 has a potentiometer 36 connected between the output 28 of the preamplifier stage 12 and an input 38 of the output stage 34 via coupling capacitor 40. The output stage 34 includes an amplifier 42 having one input 38 connected to the output 32 of the volume control circuit 30. The amplifier 42 has a fixed gain set by resistors 44 and 46 and has an output 48 connected to a transducer, for example, speaker 50.

In the preamplifier stage, the amount of undistorted amplification available is typically limited by the available battery supply voltage. In conventional ear-level hearing aids, the battery supply voltage is typically limited to 1.25 volts available from a zinc-air battery cell. If the input sound level (amplitude) increases dramatically, the resulting amplified signal at the output of the preamplifier stage tries to exceed the available battery voltage and thus the preamplifier saturates and the output signal becomes distorted, that is, it clips.

Various amplifiers, such as class A and class D amplifiers, may be employed at the output stage. Such amplifiers are subject to an overload effect when the input sound level reaches certain thresholds. When using class A amplifiers in the output stage, a signal delivered to the output stage 34 from the preamplifier stage 12 increases as the amplitude of the input sound level into the preamplifier stage 12 increases. When the voltage at the output 28 of the preamplifier 12 reaches the limits of the battery supply voltage, no further amplification can take place. If the input sound level at microphone 18 continues to drive the preamplifier stage, the amplifier will saturate and distortion will occur.

A similar overload effect may also occur when using class D amplifiers in the output stage, though the saturation mechanism is different. Using a class D amplifier, the output stage 34 operates by producing a variable pulse-width modulated signal across the transducer 50, for example, the speaker coil. As either the input sound level or the amount of system amplification is increased, the pulses eventually merge into each other and the output signal reaches saturation, thus causing distortion, for example, in the form of peakclipping. Typically, for a class D amplifier, distortion begins at about 3 dB below maximum acoustic output.

Peakclipping may be unintentional, such as when the output amplifier is over driven, or peakclipping may be intentional, such as when the saturated sound pressure level (SSPL) of a hearing aid is reduced by a peakclipping circuit.

Saturation distortion that occurs due to overdriving or output clipping in an amplifier should be distinguished from low levels of distortion that can occur inside a hearing aid with low-input levels. Saturation distortion occurs when the input level is so high that saturation is reached either in the pre-amplifier stage or in the output stage or in both stages. When this occurs, the waveform becomes highly distorted. Even in instances where a hearing aid is intentionally configured to produce low distortion at low-input levels, saturation distortion will occur at some point as the input sound level is increased beyond the capabilities of the battery, the amplifier stage, and the output stage.

The high-distortion effects of saturation can be seen graphically in FIG. 2 for a typical class D peak-clipping hearing aid used in the hearing aid circuit of FIG. 1. The peak acoustic gain of this hearing aid was 35 dB, the peak saturated sound pressure level (SSPL) was 107 dB, and the frequency response matrix slope (i.e., the difference in acoustic gain between peak and 500 Hz.) was 10 dB. As seen in FIG. 2 a plot of the harmonic distortion versus frequency for input sound levels of 60, 70, 80 and 90 dB is provided. These input sound levels correspond to soft speech, conversational speech, loud speech, and shouted speech, respectively. The distortion performance graph shows that the level of distortion is low at low-input sound levels, for example, 60 dB and 70 dB, and is in the area of 2 or 3 percent. When the input sound level is increased, for example, to 80 dB, the hearing aid goes rapidly into saturation and the level of distortion increases dramatically, with the percentage of distortion peaking at about 50 percent. At an input sound level of 90 dB, the percentage of distortion continues to increase and typically exceeds the 50 percent distortion plateau, especially in the mid-frequencies, for example between 900 Hz and 2000 Hz.

The use of compression circuits at the amplifier stages has been shown to reduce the saturation distortion of conventional hearing aids. These types of configurations are also known as compression amplifiers. However, conventional compression amplifiers typically do not provide a compression function that is linear. Instead, because of limitations in the electronic components which form the compression amplifier, the compression function is non-linear, for example, stepped or curved. FIG. 3 is a graphical representation of an example of two possible non-linear compression functions compared to a linear compression function for a compression amplifier with a compression ratio of 2 to 1. The graph illustrates a 10 dB change in the input acoustic sound pressure level over a range of between 60 dB and 90 dB. Ideally, in such a scenario the change in the output acoustic sound pressure level should be 5 dB for every 10 dB change in input acoustic sound pressure level. However, as noted above and as seen in FIG. 3, in this example, the conventional compression amplifier has a non-linear compression function over the dynamic range of the amplifier.

As a result, the compression function is linear between 60 dB and 80 dB and the output sound pressure level change is compressed by 5 dB for every 10 dB change in the input sound level. When the input acoustic sound pressure level changes from 80 dB to 90 dB, the compression function becomes non-linear and the output acoustic sound pressure level is compressed by, for example, 4 dB or 6 dB.

Therefore, a need exists for a compression circuit which provides a linear compression function over a wide dynamic range, such as between 60 dB and 90 dB.

SUMMARY

The present invention provides an amplifier that uses gain compression techniques to provide linear gain control over a wide dynamic range. In one embodiment, the compression amplifier includes an amplifier, such as an operational amplifier, having input and output legs, a gain controller coupled between the input and output legs of the amplifier, and a gain control circuit. The gain controller is responsive to a gain control signal generated by the gain control circuit to permit continuous gain adjustment of the amplifier. Preferably, the gain controller is a current controlled resistor.

The gain control circuit has an input coupled to the amplifier output and an output coupled to the gain controller. The gain control circuit is configured to compare an output voltage on the amplifier output with a predetermined threshold voltage and to generate the gain control signal on the gain control circuit output. As noted, this signal, when activated, provides continuous gain adjustment of the amplifier when the amplifier output voltage is greater than the threshold voltage. Preferably, the gain control circuit provides means, such as a relay, for selectively controlling the gain control signal so that when the amplifier output exceeds the threshold signal level the gain control signal is generated. Typically, the predetermined threshold voltage is set to a value below a voltage where the amplifier saturates.

The gain control circuit according to the present invention includes a rectifier circuit portion having an input coupled to the output of the amplifier and an output. The output of the rectifier circuit portion is a DC voltage. A voltage comparing circuit portion is provided to receive the rectified voltage and the predetermined threshold voltage and to generate an output voltage which is the difference between the rectified voltage and the threshold voltage. A summing circuit portion has a first input coupled to the output of the voltage comparing circuit portion and a second input coupled to a sub-threshold amplifier. The summing circuit portion generates an output signal that is the sum of the voltages on the first and second inputs. The gain control circuit also includes a current generating circuit portion having an input coupled to the output of the summing circuit and an output coupled to the gain controller. The current generating circuit generates the required control current to adjust the gain of the amplifier. The control current is proportional to the rectified voltage and the threshold voltage.

The present invention also provides a hearing aid that utilizes the compression amplifier of the present invention to improve the sound quality heard by a user. The hearing aid includes a preamplifier network having an input connected to a sound detector and an output connected to an output drive network. The output drive network has an input connected to the output of the preamplifier network and an output connected to a sound transducer.

The preamplifier network includes the compression amplifier of the present invention. Thus, the preamplifier network has an amplifier with input and output legs, a gain controller coupled between the input leg and output leg of the amplifier, and a gain control circuit connected to the amplifier and the gain controller. The gain controller is responsive to a gain control signal generated by the gain control circuit so as to permit continuous gain adjustment of the amplifier.

In this embodiment of the hearing aid, the output drive network also includes the above-described compression amplifier of the present invention. Thus, the output drive network has an amplifier, a gain controller, and a gain control circuit which operate to automatically adjust the gain of the amplifier to provide a quality sound to be emitted by the sound transducer.

Preferably, the hearing aid also includes a volume control circuit connected between the output of the preamplifier network and the input of the output drive network which permits the user to attenuate the volume of the sound emitted from the sound transducer. An example of a suitable volume control circuit is a variable resistor connected in a voltage divider configuration between the output of the preamplifier network and the input of the output drive network.

In an alternative embodiment, the hearing aid according to the present invention includes a preamplifier network and an output drive network wherein the preamplifier network uses the compression amplifier and the output drive network has a fixed gain.

In another alternative embodiment, the hearing aid includes a preamplifier network and an output drive network wherein the preamplifier network has a fixed gain and the output drive network has a fixed gain and the output drive network use the compression amplifier of the present invention.

BRIEF DESCRIPTION OF THE DRAWINGS

Preferred embodiments of the invention are described hereinbelow with reference to the drawings wherein:

FIG. 8 is a graphical representation of the sound distortion characteristics for the hearing aid of FIG. 7; and FIG. 9 is an alternative embodiment for a hearing aid using the compression amplifier of the present invention.

DETAILED DESCRIPTION

Compression parameters of the compression amplifier according to the present invention are dependent upon certain mathematical representations defined herein. The compression amplifier according to the present invention provides two basic modes of operation. The first mode is identified as a "below threshold mode" and the second mode is identified as an "above threshold mode". In the below threshold mode, the compression amplifier provides a fixed gain independent of the input acoustic sound pressure level. In the above threshold mode, the compression amplifier provides a variable gain that is dependent upon the input acoustic sound pressure level, the desired compression ratio and the gain transfer compression threshold factor of the compression amplifier. The compression ratio (CR) is defined as the ratio of the rise in the amplifier input acoustic sound pressure level increase or rise (IR), in decibels, to the increase in the output acoustic sound pressure level (OI), in decibels, and can be expressed as follows:

compression ratio=input increase/output increase

The gain transfer factor (GT) of the compression amplifier is defined as the ratio of the amplifier gain reduction (GR), in decibels, to the output increase in sound pressure level (OI), in decibels, during a specified range of the input increase (IR) in sound pressure level, and can be expressed as follows:

gain transfer=gain reduction/output increase

A relationship of these compression amplifier parameters is provided below in table I.

TABLE I

| Input Increase | Output Increase | Gain Reduction | Compression Ratio | Gain Transfer |
|---|---|---|---|---|
| 10 dB | 10 dB | 0 dB | 1:1 | 0.0 |
| 10 dB | 9 dB | 1 dB | 1.11:1 | 0.11 |
| 10 dB | 8 dB | 2 dB | 1.25:1 | 0.25 |
| 10 dB | 7 dB | 3 dB | 1.43:1 | 0.43 |
| 10 dB | 6 dB | 4 dB | 1.67:1 | 0.67 |
| 10 dB | 5 dB | 5 dB | 2:1 | 1.00 |
| 10 dB | 4 dB | 6 dB | 2.5:1 | 1.50 |
| 10 dB | 3 dB | 7 dB | 3.33:1 | 2.33 |
| 10 dB | 2 dB | 8 dB | 5:1 | 4.00 |

Figure 1:
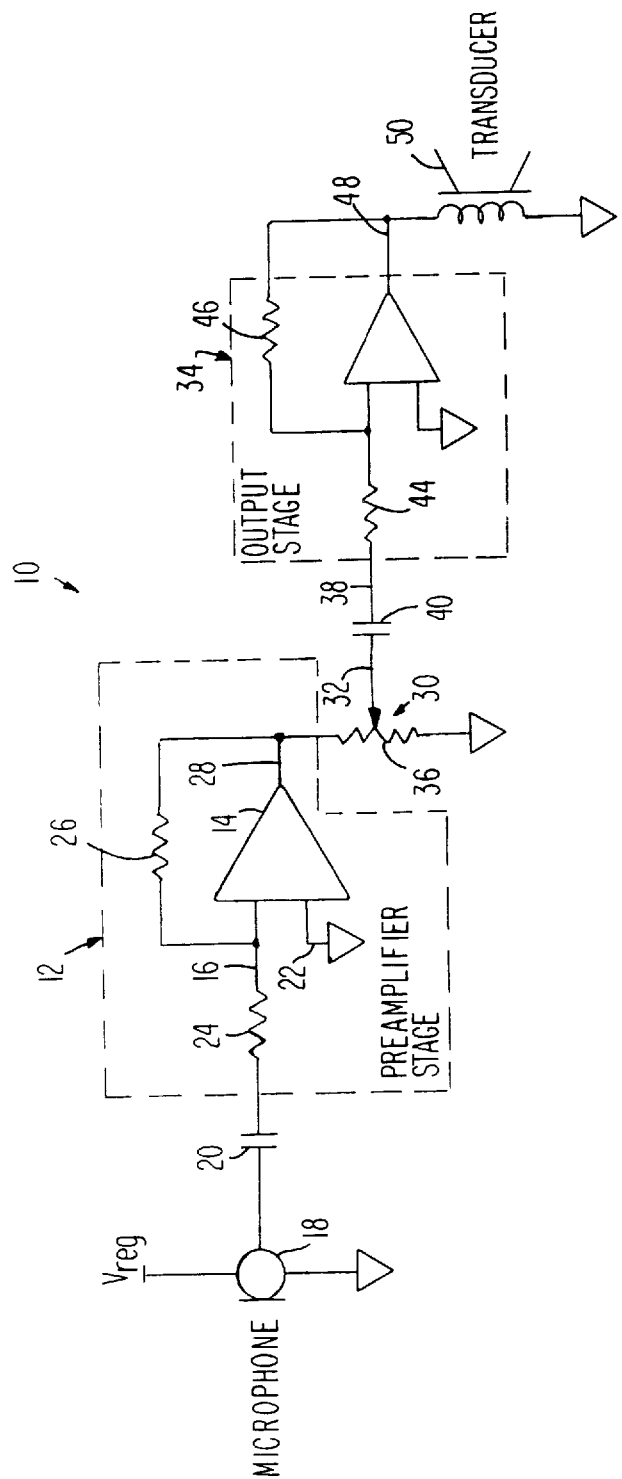
FIG. 1 is a circuit diagram for a conventional hearing aid.
Figure 2:
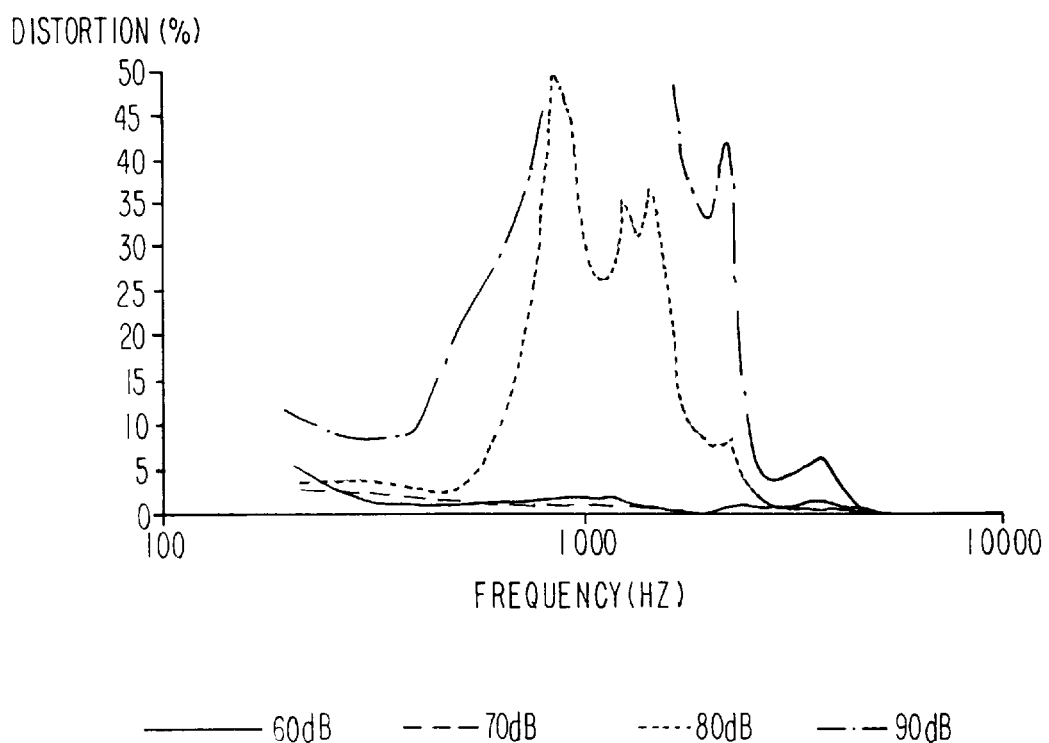
FIG. 2 is a graphical representation of sound distortion performance characteristics in the conventional hearing aid of FIG. 1 at different input sound levels.
Figure 3:
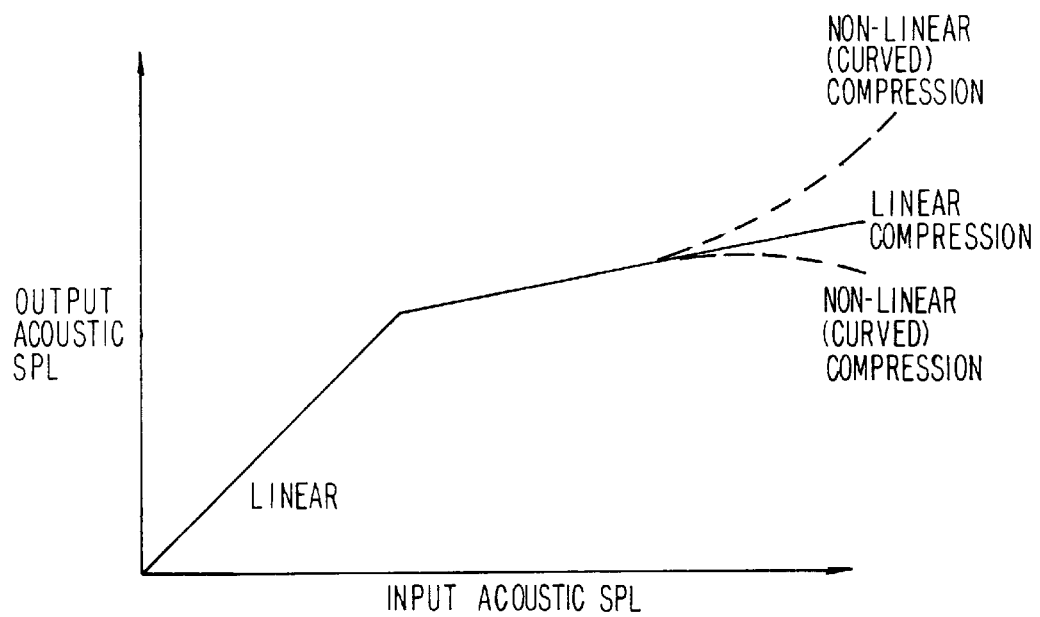
FIG. 3 is a graphical representation of an exemplary compression function for a conventional hearing aid using a conventional compression amplifier at the preamplifier stage.
Figure 4:
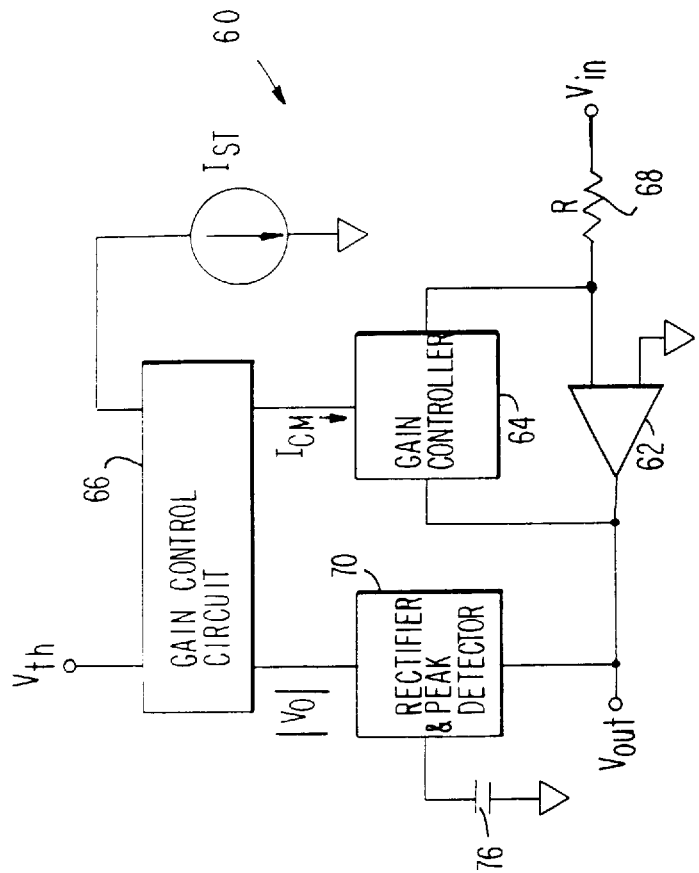
FIG. 4 is a block diagram of the compression amplifier according to the present invention.

Referring now to FIG. 4, the preferred embodiment of the compression amplifier 60 is shown. The compression amplifier 60 includes an amplifier 62, preferably an operational amplifier, a gain controller 64, a rectifier and peak detector circuit 70, and a gain control circuit 66 responsive to the rectified output of the amplifier so as to control the gain controller 64. The gain controller may be a variable resistor or other equivalent devices which are capable of controlling the gain of the amplifier 62. Preferably, the gain controller 64 is a current-controlled variable resistor that has a small signal resistance that is inversely proportional to the DC current flowing through the gain control circuit. The gain of the operational amplifier 62 is controlled by fixed resistor 68 having a value R and the gain controller 64. As seen in FIG. 4, the gain control circuit 66 is connected in the feedback path of the operational amplifier 62. When operating in the above threshold mode, the desired compression function can be realized by modulating the current flowing through the fixed resistor 68, such that as the current increases the gain of the amplifier 60 decreases, and as the current decreases the gain increases. The compression amplifier continues to operate as such until the compression amplifier is operating in the below threshold mode where the gain is fixed.

The following equations may be used to determine certain parameters for the compression amplifier 60 of the present invention and to determine the gain control current ($I_{cm}$) necessary to adjust the gain of amplifier 62 via gain controller 64. The gain control current ($I_{cm}$) required for a certain compression ratio is the ratio of the rectified compression amplifier output voltage $|V_o|$ divided by the predetermined threshold voltage ($V_{th}$), taken to the power of the gain transfer factor (GT) for that specific ratio, and the result of the ratio is multiplied by the sub-threshold gain current ($I_{st}$). To determine the gain transfer factor (GT), the suprathreshold gain reduction factor (GR) of the amplifier 60 is first ascertained:

$$GR = 20\log_{10}\left[\frac{R_{st}}{R}\right] - 20\log_{10}\left[\frac{R_{cm}}{R}\right] \quad \text{EQ. 1}$$

$$GR = 20[\log_{10}[R_{st}] - \log_{10}[R] - \log_{10}[R_{cm}] + \log_{10}[R]] \quad \text{EQ. 2}$$

$$GR = 20\left[\log_{10}\left[\frac{R_{st}}{R}\right] - \log_{10}\left[\frac{R_{cm}}{R}\right]\right] \quad \text{EQ. 3}$$

$$GR = 20[\log_{10}[R_{st}] - \log_{10}[R_{cm}]] \quad \text{EQ. 4}$$

$$GR = 20\log_{10}\left[\frac{R_{st}}{R_{cm}}\right] \quad \text{EQ. 5}$$

where R is the value of resistor 68.

If the gain controller is a variable resistor, then the resistance of the variable resistor 64, above and below the threshold is inversely proportional to the gain control current $I_{cm}$ and $I_{st}$. In this instance, the variable resistor values $R_{cm}$ and $R_{st}$ can be substituted with $1/I_{st}$ and $1/I_{cm}$, respectively, to yield the following equation for the gain reduction factor:

$$GR = 20\log_{10}\left[\frac{I_{cm}}{I_{st}}\right] \quad \text{EQ. 6}$$

The output increase in sound pressure level (OI) for the compression amplifier 60 can then be defined by the following equation:

$$OI = 20\log_{10}\left[\frac{|V_o|}{V_{th}}\right] \quad \text{EQ. 7}$$

As noted above, the gain transfer factor (GT) of the compression amplifier is the ratio of the gain reduction (GR) to the output acoustic sound pressure level increase (OI) which yields the following equation:

$$GT = \frac{GR}{OI} = \frac{20\log_{10}\left[\frac{I_{cm}}{I_{st}}\right]}{20\log_{10}\left[\frac{|V_o|}{V_{th}}\right]} \quad \text{EQ. 8}$$

Equation 8 can be reduced as follows to obtain the desired gain control current ($I_{cm}$) to establish the proper compression function for the particular input acoustic sound pressure level:

$$GT\left[\log_{10}\left[\frac{|V_o|}{V_{th}}\right]\right] = \log_{10}\left[\frac{I_{cm}}{I_{st}}\right] \quad \text{EQ. 9}$$

$$\log_{10}\left[\left[\frac{|V_o|}{V_{th}}\right]^{GT}\right] = \log_{10}\left[\frac{I_{cm}}{I_{st}}\right] \quad \text{EQ. 10}$$

$$\left[\frac{|V_o|}{V_{th}}\right]^{GT} = \frac{I_{cm}}{I_{st}} \quad \text{EQ. 11}$$

$$I_{cm} = I_{st}\left[\frac{|V_o|}{V_{th}}\right]^{GT} \quad \text{EQ. 12}$$

Thus, as noted above, equation 12 provides that the gain control current ($I_{cm}$) required for a certain compression ratio is the ratio of the rectified compression amplifier output voltage $|V_o|$ divided by the predetermined threshold voltage ($V_{th}$), taken to the GTth power for that specific ratio, and the result of the ratio is multiplied by the sub-threshold gain current ($I_{st}$).

Figure 5:
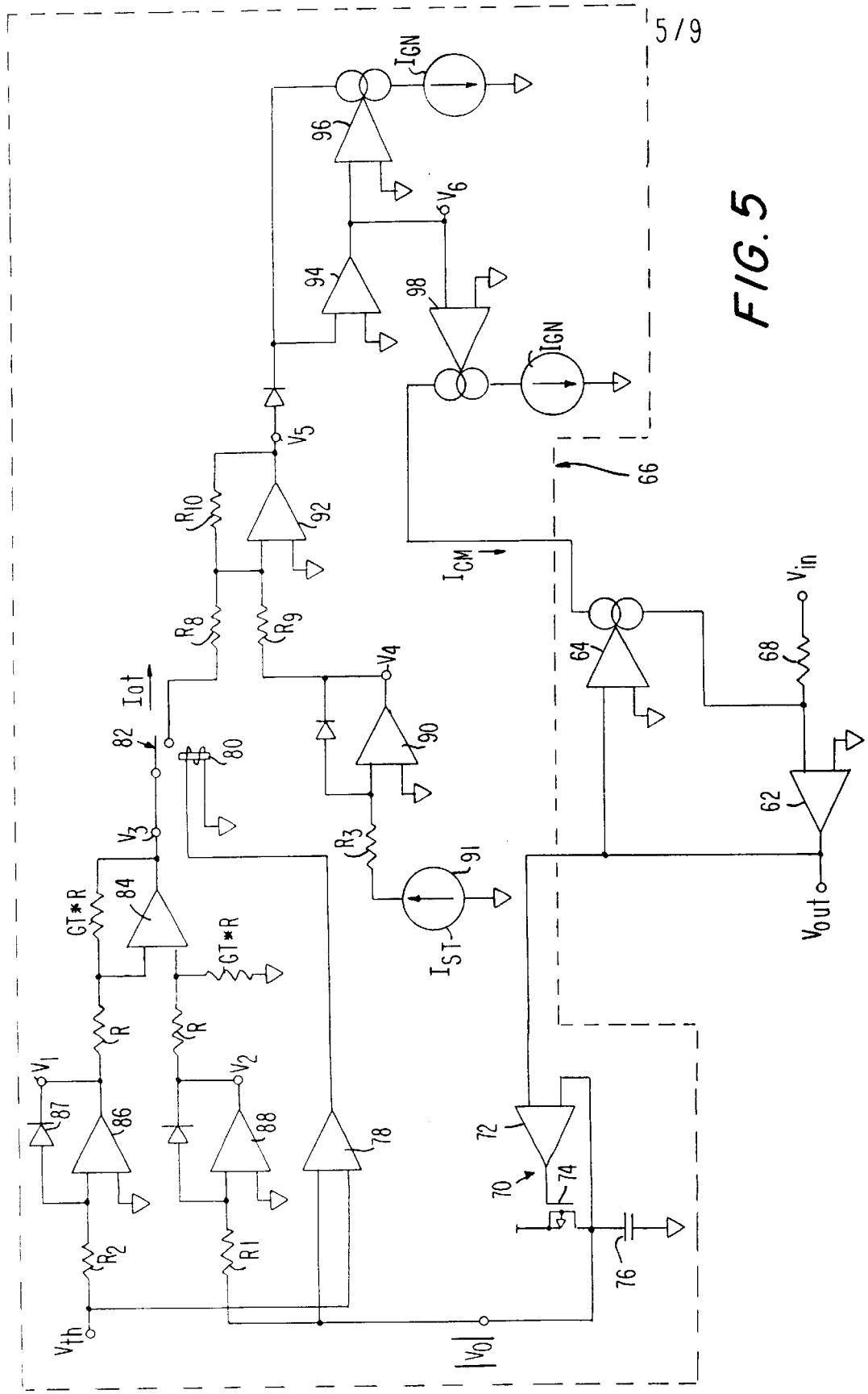
FIG. 5 is a circuit diagram for the compression amplifier according to the present invention, illustrating a gain control circuit connected to an amplifier and a current controlled resistor.

FIG. 5 provides a circuit diagram of a compression amplifier for generating the desired gain control current. In the embodiment of FIG. 5, the compression amplifier output voltage ($V_{out}$) is connected to a half-wave rectifier and peak detector circuit within the gain control circuit 66. The half-wave rectifier circuit 70 includes amplifier 72, PMOS-FET transistor 74, and capacitor 76. Although the rectifier circuit shown is a half-wave rectifier, as noted above, a full-wave rectifier circuit may also be used. Further, capacitor 76 is a primary compensation element for the feedback loop and has a value that is chosen so its delay characteristic is dominant over the time delay through the feedback loop. The rectified output voltage $|V_o|$ of the rectifier circuit 70 is fed to a comparator 78 that compares the rectified output voltage $|V_o|$ with a predetermined threshold voltage ($V_{th}$). If the rectified output voltage $|V_o|$ is less than the threshold voltage ($V_{th}$) then solenoid 80 in relay switch 82 is not energized and the relay switch remains open. In this instance, the compression amplifier 60 is operating in the below threshold mode and the gain control current $I_{cm}$ is fixed so that the variable resistor 64 sets the gain of amplifier at maximum gain. In the circuit of FIG. 5, the gain control current ($I_{cm}$) is about 1 μA which sets the gain of amplifier 62 to about 30 dB. Thus, in this configuration, when the output voltage ($V_{out}$) of the operational amplifier 62 is below the predefined compression threshold voltage ($V_{th}$), the operational amplifier 62 has a fixed gain that does not vary with the input voltage to the operational amplifier ($V_{in}$), that is, the gain is independent of the input acoustic sound pressure level.

If the rectified output voltage $|V_o|$ is greater than the threshold voltage ($V_{th}$) then the output of the comparator 78 energizes the relay solenoid 80 and closes relay switch 82, so as to enable operation of the gain compression feature. When the relay switch is closed, amplifier 84 acts as a difference amplifier to subtract the output voltage ($v_1$) of logarithmic amplifier 86 from the output voltage ($V_2$) of logarithmic amplifier 88 and to scale the result by the gain transfer factor (GT). The output voltage ($V_3$) of difference amplifier 84 is summed with the output voltage ($V_4$) of logarithmic amplifier 90 by summing amplifier 92. The summed output voltage ($V_5$) is fed to amplifier 94 and operational transconductance amplifier 96 that form a feedback voltage-to-current converter. The output voltage ($V_6$) of amplifier 94 controls operational transconductance amplifier 98 to provide the desired gain control current ($I_{cm}$) to current-controlled resistor 64. Thus, when the output voltage of the operational amplifier 62 rises above the predetermined threshold voltage ($V_{th}$), the current ($I_{st}$) in current source 91 increases at a rate sufficient to maintain a constant compression ratio.

In essence, amplifiers 84 through 98 and their associated discrete components operate as a compression control signal processor that generates and provides the desired current to control the variable resistor 64. As noted above, the current controlled variable resistor 64 is preferably an operational transconductance amplifier that changes the gain of the amplifier 62 as the current increases or decreases. An example of a suitable transconductance amplifier is the model LM3080 manufactured by National Semiconductor Corporation.

As noted above, the current required to provide the proper resistance for the variable resistor is the gain control current ($I_{cm}$). The gain control current is the sum of the amount of current required to provide the proper resistance for providing the sub-threshold gain ($I_{st}$) and the gain reduction current ($I_{at}$), seen in FIG. 5. The resistance parameters for the variable resistor 64 are identified as $R_{cm}$ and $R_{st}$ at the current values of $I_{cm}$ and $I_{st}$.

To rationalize the operational characteristics of the circuit of FIG. 5, certain values should be initially defined. The forward current through a diode $I_d$ and the forward diode voltage $V_d$ are represented below:

$$I_d = I_s[e^{V_d/vt}] \qquad \text{EQ. 13}$$

$$V_d = vt\left[\ln\frac{I_d}{I_s}\right] \qquad \text{EQ. 14}$$

In these equations, $I_s$ is the transport saturation current of a semiconductor junction, and vt is the thermal voltage of a semiconductor junction. Typically, vt is 25.7 mV at 300K.

Turning now to FIG. 5, the output voltage ($V_2$) of logarithmic amplifier 88 is;

$$\frac{|V_o|}{R_1} = I_s\left[e^{-\frac{V_2}{vt}}\right] \qquad \text{EQ. 15}$$

$$V_2 = -vt\left[\ln\left[\frac{|V_o|}{[I_s][R_1]}\right]\right] \qquad \text{EQ. 16}$$

and the output voltage ($V_1$) of logarithmic amplifier 86 is defined by equation 17:

$$V_1 = -vt\left[\ln\left[\frac{V_{th}}{[I_s][R_2]}\right]\right] \qquad \text{EQ. 17}$$

Amplifier 84 is a difference amplifier having an output voltage $V_3$:

$$V_3 = GT[V_2 - V_1] \qquad \text{EQ. 18}$$

Substituting $V_1$ and $V_2$ from equations 16 and 17 in equation 18 yields the following result for the output voltage $V_3$ of the difference amplifier 84:

$$V_3 = [GT][-vt]\ln\left[\left[\frac{|V_o|}{[I_s][R_1]}\right]\left[\frac{[I_s][R_2]}{V_{th}}\right]\right] \qquad \text{EQ. 19}$$

If resistors $R_1$ and $R_2$ connected to amplifiers 88 and 86 are equal, and the diode terms $I_s$ for diodes 87 and 89 are equal, then equation 19 reduces to equation 20.

$$V_3 = [-vt]\ln\left[\left[\frac{|V_o|}{V_{th}}\right]^{GT}\right] \qquad \text{EQ. 20}$$

The output voltage ($V_4$) of logarithmic amplifier 90 that, as noted above, provides a fixed amount of gain to variable resistor 64 so as to provide the correct sub-threshold gain, that is, to provide the proper current to variable resistor 64 when in the below threshold mode to set the gain of amplifier 62 for maximum gain:

$$V_4 = -vt\left[\ln\left[\frac{I_{st}}{I_s}\right]\right] \qquad \text{EQ. 21}$$

When the relay switch 82 is closed, the amplifier 92 acts as a summing amplifier having an output voltage $V_5$. If resistors $R_8$, $R_9$ and $R_{10}$ connected to amplifier 92 are equal, than the output voltage $V_5$ is the inversion of voltages $V_3$ and $V_4$:

$$V_5 = -[V_3 + V_4] \qquad \text{EQ. 22}$$

Substituting the values for $V_3$ and $V_4$ from equations 20 and 21 into equation 22 yields the following representation for the output voltage ($V_5$) of amplifier 92:

$$V_5 = [vt]\ln\left[\left[\frac{|V_o|}{V_{th}}\right]^{GT}\right] + [vt]\ln\left[\frac{I_{st}}{I_s}\right] \quad \text{EQ. 23}$$

$$V_5 = [vt]\ln\left[\left[\frac{I_{st}}{I_s}\right]\left[\frac{|V_o|}{V_{th}}\right]^{GT}\right] \quad \text{EQ. 24}$$

By knowing the output voltage of amplifier 92, the gain control current ($I_{cm}$) can be expressed as follows:

$$I_{cm}=[I_s]e^{V_5/vt} \quad \text{EQ. 25}$$

Substituting $V_5$ from equation 24 into equation 25 yields the following representation for the gain control current:

$$I_{cm} = [I_s]\,e^{\left[\frac{[vt]\ln\left[\left[\frac{I_{st}}{I_s}\right]\left[\frac{|V_o|}{V_{th}}\right]^{GT}\right]}{vt}\right]} \quad \text{EQ. 26}$$

which can be reduced as follows to obtain the expression for the gain control current $I_{cm}$. Thus, following the above example, the circuit shown in FIG. 5 provides a gain control which continuously controls the gain of amplifier 62 when the rectified output voltage |Vo| exceeds the predefined threshold voltage ($V_{th}$).

$$I_{cm} = [I_s]\left[\frac{I_{st}}{I_s}\right]\left[\frac{|V_o|}{V_{th}}\right]^{GT} \quad \text{EQ. 27}$$

$$I_{cm} = I_{st}\left[\frac{|V_o|}{V_{th}}\right]^{GT} \quad \text{EQ. 28}$$

Figure 6:
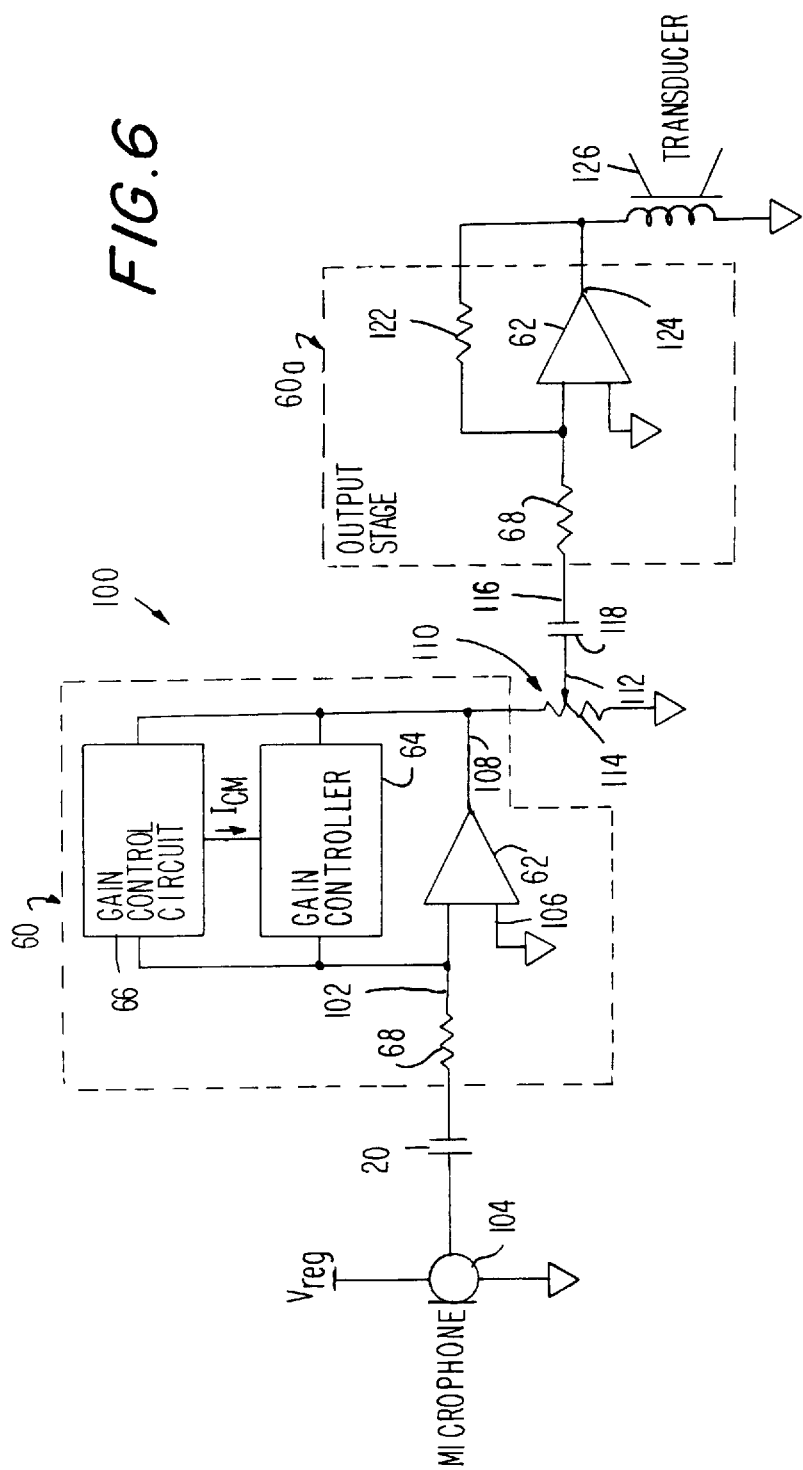
FIG. 6 is a circuit diagram for a hearing aid using the compression of the present invention at the preamplifier stage.
Figure 7:
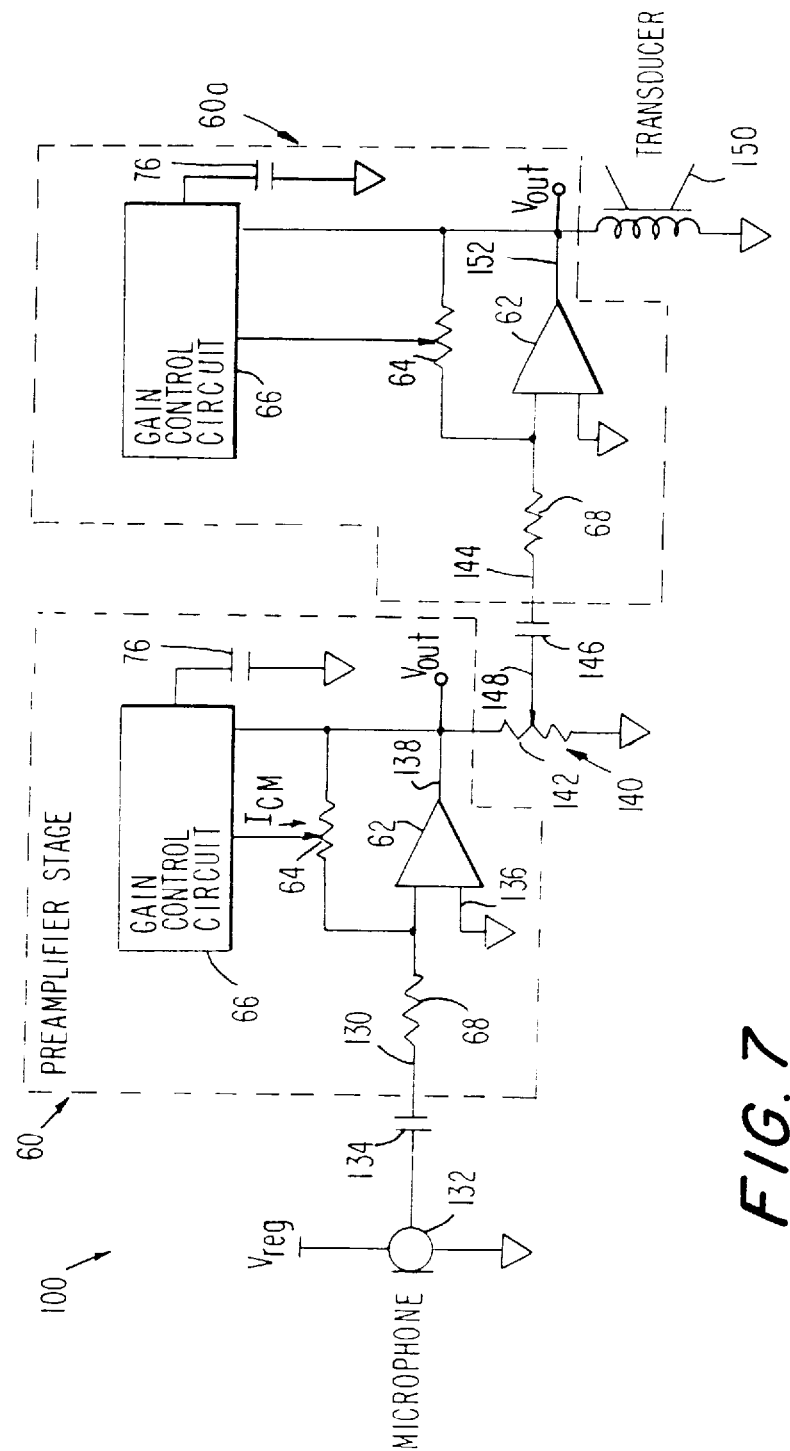
FIG. 7 is a circuit diagram for a hearing aid using the compression amplifier of the present invention in the preamplifier stage and the output stage.

Turning now to the embodiments of FIGS. 6 and 7, the compression amplifier 60 of the present invention may be used in a preamplifier stage, an output stage, or in both stages of a hearing aid. Of course, utilizing the compression amplifier at both stages of the hearing aid improves the sound quality to the user over hearing aids with a single compression amplifier.

As discussed above, signal clipping can occur at the output of the preamplifier stage and at the output of the output stage. The point at which the preamplifier output clips is dependent upon the amplitude of the input signal from the microphone, that is, the input acoustic sound pressure level, the preamplifier gain, and the battery voltage. Typically, clipping occurs when the input acoustic sound pressure level reaches about 80 dB. Clipping at the output stage is a function of the input acoustic sound pressure level from the microphone, the preamplifier gain, the battery voltage, the level of attenuation provided by the volume control circuit, and the gain of the output stage.

To illustrate, if the volume control circuit is set by the user for minimum attenuation and the input signal from the microphone increases in magnitude over time, the output of the output stage will clip before the preamplifier stage output, because of the gain of the output stage. On the other hand, if the volume control circuit attenuation is adjusted so that the amplitude of the input signal to the output stage is reduced by the same value or a greater value than the gain of the output stage, then the preamplifier stage will clip before the output stage.

To overcome this problem and minimize clipping in the hearing aid, the output of the preamplifier stage and the output of the output stage can be individually sensed and controlled through compression. The compression thresholds for both stages are preferably set as high as possible without causing clipping. Typically, a compression ratio of 10:1 is suitable for hearing aids.

Referring to FIG. 6, one embodiment for utilizing the compression amplifier of the present invention is shown. In this embodiment, the preamplifier stage utilizes the compression amplifier of the present invention to provide a fixed gain when in the below threshold mode and a variable gain when in the above threshold mode. The output stage has a fixed gain.

As seen in FIG. 6, the preamplifier stage of hearing aid 100 includes amplifier 62 having one input 102 connected to a microphone 104 via coupling capacitor 20 and another input 106 connected to ground. The amplifier 62 has a gain which is set by resistor 68 and gain controller 64. The output 108 of the preamplifier stage is connected to a user adjustable volume control circuit 110 having an output 112 connected to the output stage of the hearing aid 100. The volume control circuit 110 has a potentiometer 114 connected between the output 108 of the preamplifier stage and an input 116 of the output stage via coupling capacitor 118. The output stage includes an amplifier 62 having one input 116 connected to the output 112 of the volume control circuit 110. The output stage amplifier 62 has a fixed gain set by resistors 68 and 122 and has an output 124 connected to a transducer, for example, loud speaker 126.

Referring again to FIG. 6, in operation the input sound level, whether it be soft speech, conversational speech, loud speech and shouted speech is detected by the microphone 104 and filtered and amplified by the preamplifier stage. The amplified signal from the preamplifier stage passes through the volume control circuitry where it may be attenuated depending upon the setting of potentiometer 114. The output of the volume control circuit is transferred to the output stage for amplification. The output stage amplifies the signal and drives the transducer, such as loud speaker 126.

As the input sound level is filtered and amplified, the preamplifier stage gain control circuit 66 senses or measures the voltage of the output signal of the amplifier 62. If the voltage of the amplifier output signal exceeds the predefined threshold voltage the gain of the amplifier 62 is automatically decreased by adjusting the resistance of variable resistor 64. Preferably, the predefined threshold voltage is 7.8 mV (rms) input-referred which typically corresponds to an 85 dB sound pressure level acoustic input with a battery voltage of 1.25 volts. As the output voltage of the amplifier attempts to increase beyond the predetermined threshold voltage, the resistance of the variable resistor 64 is adjusted so that the amplifier continues to operate in the linear region and thus inhibits the amplifier 62 from saturating.

Referring to FIG. 7, another embodiment for using the compression amplifier of the present invention is shown. As shown, the preamplifier stage utilizes a compression amplifier 60 having one input 130 connected to an input receiver, such as microphone 132, via coupling capacitor 134, and another input 136 connected to ground. The amplifier 62 has an adjustable gain set by fixed resistor 68 and variable resistor 64. Preferably, the variable resistor is a current controlled resistor responsive to a control current ($I_{cm}$) supplied by a gain control circuit 66. The current controlled resistor has a predetermined voltage-to-current transfer function (transconductance) which is directly proportional to the control current supplied by the gain control circuit. An example of a suitable current controlled resistor is a operational transconductance amplifier (OTA) model LM3080 manufactured by National Semiconductor Corporation.

The preamplifier stage gain control circuit 66 is connected to the output 138 of amplifier 62 and to variable resistor 64, as seen in FIG. 7. The gain control circuit 66 measures or detects the voltage of the output signal from the amplifier 62 and compares the measured voltage with a predetermined threshold voltage. Preferably, the predetermined threshold voltage is 7.8 mV (rms) input-referred. If the measured voltage is greater than the threshold voltage, then the gain control circuit 66 varies the resistance of variable resistor 64 so as to reduce the gain of the preamplifier stage amplifier 62. If the measured voltage is less than the threshold voltage then the gain control circuit generates a current that sets the variable resistor 64 for maximum gain of amplifier 62.

As described above, the gain control circuit 66, the resistor 68, the variable resistor 64, and the amplifier 62 form a preamplifier compression feedback loop or compression amplifier 60 which controls the gain of the amplifier 62. The preamplifier compression amplifier is provided to reduce the gain of the preamplifier stage just before the output signal of the amplifier 62 exceeds the capabilities of the supply voltage, that is, prior to amplifier saturation. Utilization of the gain control circuit 66 causes the preamplifier stage amplifier 62 to amplify within its linear region and thus prevents the amplifier from saturating. Hence, saturation distortion, for example, peak-clipping is limited or substantially minimized even when the input sound level is high, for example, exceeds 85 dB.

The preamplifier stage in a hearing aid is typically followed by a user adjustable volume control circuit 140 that permits a practitioner or patient to adjust the output sound level of the hearing aid 100 for maximum comfort. In the embodiment of FIG. 7, a variable resistor, such as potentiometer 142 is connected as a voltage divider to ground between an output 138 of the preamplifier stage and an input 144 of the output stage via coupling capacitor 146.

The output stage of the hearing aid 100 includes an amplifier 62 having an input connected to the output 148 of volume control circuit 140. The output stage also has an adjustable gain set by fixed resistor 68 and variable resistor 64 and is provided to drive a hearing aid transducer in the form of loud speaker 150. Gain control circuit 66 is connected to the output 152 of amplifier 62 and to variable resistor 64. Similar to the gain control circuit for the preamplifier stage, the output stage gain control circuit 66 measures or detects the output voltage ($V_{out}$) of the amplifier 62 and compares the measured voltage with a predetermined threshold voltage ($V_{th}$). Preferably, the threshold voltage is 880 mV (rms) output-referred when using a class B push-pull amplifier or a class D pulse-width modulated amplifier circuit in the output stage. If the measured voltage is greater than the threshold voltage, then the gain control circuit 66 the resistance of variable resistor 64 so as to reduce the gain of the output stage amplifier 62. If the measured voltage is less than the threshold voltage then the gain control circuit generates a current that sets the variable resistor 64 for the maximum gain of amplifier 62.

In the output stage, the gain control circuit 66, the resistor 68, the variable resistor 64, and the amplifier 62 form an output stage compression amplifier 60, that controls the gain of the amplifier 62. The output stage compression amplifier is provided to reduce the gain of the output stage just before the output signal of the amplifier 62 exceeds the capabilities of the supply voltage, that is, prior to amplifier saturation. Utilization of the gain control circuit 66 causes the output stage amplifier 62 to amplify within its linear region and thus prevents the amplifier from saturating. Hence, saturation distortion, for example, peak-clipping is limited or substantially minimized even when the input sound level exceeds 85 dB.

As described above, the compression amplifiers of the present invention are used in hearing aids to minimize the sound distortion in the hearing aid, especially when the input sound level increases. In addition, the compression amplifier provides a constant compression ratio, for example, 10:1, so as to ensure a predictable output signal amplitude from the preamplifier stage amplifier 62 and the output stage amplifier 62 for any input signal amplitude into the amplifier.

Referring again to FIG. 7, in operation the input sound level, whether it be soft speech, conversational speech, loud speech and shouted speech is detected by the microphone 132 and amplified by the preamplifier stage. The amplified signal from the preamplifier stage passes through the volume control circuitry where it may be attenuated depending upon the setting of potentiometer 142. The output of the volume control circuit is transferred to the output stage for amplification. The output stage amplifies the signal and drives the transducer, such as loud speaker 150.

As the input sound level is amplified, the gain control circuit 66 senses or measures the voltage of the output signal of the amplifier 62. If the voltage of the amplifier output signal exceeds the predefined threshold voltage, preferably 7.8 mV (rms) input-referred, the gain of the amplifier 62 is automatically decreased by adjusting the resistance of variable resistor 64. As the output voltage of the amplifier attempts to increase beyond the predetermined threshold voltage, the resistance of the variable resistor 64 is adjusted so that the amplifier continues to operate in the linear region and thus inhibits the amplifier 62 from saturating.

Similarly, the output voltage of the output stage amplifier 62 is sensed or measured by the output stage gain control circuit 66. If the voltage of the amplifier output exceeds the predefined threshold voltage, preferably 880 mV (rms) output-referred, the gain of the amplifier is automatically decreased by adjusting the resistance of variable resistor 64. As the output voltage of the amplifier attempts to increase beyond the predetermined threshold voltage, the resistance of the variable resistor 64 is adjusted so that the amplifier continues to operate in the linear region and thus inhibits the amplifier 62 from saturating.

A more detailed description of a hearing aid with compression amplifiers can be found in U.S. Application entitled "A HEARING AID HAVING INPUT AND OUTPUT GAIN COMPRESSION CIRCUITS", filed concurrently herewith, which is assigned to the assignee hereof and is incorporated herein by reference.

FIG. 8 provides a graphical representation of the distortion performance characteristics for a hearing aid utilizing a compression amplifier in the preamplifier and output stages.

Referring now to FIG. 9 an alternative embodiment of the hearing aid circuitry using the compression amplifier of the present invention is provided. In this embodiment, a single timing capacitor 154 is used for each gain control circuit 60 and 60*a* instead of multiple timing capacitors 76. In this alternative embodiment, the output stage has a fixed gain set by resistors 68 and 156. Each stage is still independently sensed by their respective gain control circuit 60 and 60*a*, but the amplitude of the output signal for each stage is controlled by a single gain control circuit which is preferably associated with the preamplifier stage. The compression ratio for this configuration is also high, for example, 10 to 1, thus causing one stage to dominate the compression action depending on the attenuation of the volume control circuit 140.

It will be understood that various modifications can be made to the embodiments of the present invention herein disclosed without departing from the spirit and scope thereof. For example, various types of amplifiers configurations may be utilized in the preamplifier and the output amplifier stages. Therefore, the above description should not be construed as limiting the invention but merely as exemplifications of preferred embodiments thereof. Those skilled in the art will envision other modifications within the scope and spirit of the present invention as defined by the claims appended hereto.

What is claimed is:

1. A compression amplifier having a wide dynamic range and configured to provide independent compression control, which comprises:

an amplifier having an input and an output;

a gain controller coupled between said input and output of said amplifier, said gain controller being responsive to a gain control signal for providing continuous gain adjustment of said amplifier; and a gain control circuit having an input coupled to said amplifier output and output coupled to said gain controller for comparing an output signal level on said amplifier output with a predetermined threshold signal level and for generating said gain control signal at said gain control circuit output so as to provide continuous gain adjustment of said amplifier at least when said amplifier output signal level is greater than said threshold signal level, wherein said gain control circuit includes:

a rectifier circuit portion having an input coupled to said output of said amplifier and an output, said output of said rectifier circuit portion providing a rectified signal;

a signal comparing circuit portion that receives said rectified signal and said predetermined threshold signal and generates an output signal which is the difference between said rectified signal level and said predetermined threshold signal level;

a summing circuit portion having a first input coupled to said output of said signal comparing circuit portion and a second input coupled to a sub-threshold amplifier, said summing circuit portion generates an output signal that is the sum of the signals on said first and second inputs; and a signal generating circuit portion having an input coupled to said output of said summing circuit and an output coupled to said gain controller, said signal generating circuit portion continuously generates said gain control signal that is proportional to said rectified signal level and said predetermined threshold signal level.

2. The compression amplifier according to claim 1, wherein said gain control circuit includes means for selectively controlling said gain control signal such that when said output signal level on said amplifier output exceeds said predetermined threshold signal level said gain control signal is generated at said gain control circuit output.

3. The compression amplifier according to claim 2, wherein said selective controlling means comprises a relay switch.

4. The compression amplifier according to claim 1, wherein said predetermined threshold signal level for said compression amplifier is a voltage set to a value below a voltage where said amplifier saturates.

5. The compression amplifier according to claim 4, wherein said predetermined threshold voltage ranges from between about 7.8 mV (rms) and about 880 mV (rms).

6. The compression amplifier according to claim 1, wherein said amplifier comprises an operational amplifier having a fixed resistor connected to an input of said operational amplifier.

7. The compression amplifier according to claim 1, wherein said gain controller comprises a current-controlled resistor.

8. The compression amplifier according to claim 1 further comprising a switch connected between said output of said voltage comparing circuit portion and said first input of said summing circuit portion, said switch being responsive to a mode select signal derived from a comparison of said rectified signal level and said predetermined threshold signal level such that when said rectified signal level exceeds said predetermined threshold signal level said switch is activated.

9. A compression amplifier having a wide dynamic range and configured to provide selective gain compression, comprising:

an amplifier having an input and an output;

a gain control circuit having an input coupled to said amplifier output and an output, said gain control circuit being responsive to an output signal on said amplifier output and to a predetermined threshold signal for generating an output gain control current; and a current controlled gain controller having a first input connected to said amplifier output, a second input connected to said gain control circuit output, and an output connected to said amplifier input, said gain controller being responsive to said gain control current such that when said gain control current changes said gain controller adjusts the gain of said amplifier;

wherein said gain control current is defined by:

$$I_{cm} = I_{st} \left[ \frac{|V_o|}{V_{th}} \right]^{GT}$$

and wherein said gain control circuit includes:

a rectifier circuit portion having an input coupled to said output of said amplifier and an output, said output of said rectifier circuit portion providing a rectified DC signal;

a signal comparing circuit portion receiving said rectified DC signal and said predetermined threshold signal for generating an output signal that is a difference between said rectified DC signal and said predetermined threshold signal;

a summing circuit portion having a first input coupled to said output of said signal comparing circuit portion and a second input coupled to a sub-threshold amplifier, said summing circuit portion generating an output signal that is a sum of the signals on said first and second inputs; and a current generating circuit portion having an input coupled to said output of said summing circuit and an output coupled to said gain controller, said current generating circuit portion generating said gain control current which is proportional to said rectified DC signal and said predetermined threshold signal.

10. The compression amplifier according to claim 9, wherein said predetermined threshold signal for said compression amplifier is a voltage set to a value below a voltage where said amplifier saturates.

11. The compression amplifier according to claim 10, wherein said predetermined threshold voltage ranges from between about 7.8 mV (rms) and about 880 mV (rms).

12. A hearing aid comprising:

a preamplifier network having an input connected to a sound detector and an output, wherein said preamplifier network includes a compression amplifier having an amplifier with an input leg and an output leg corresponding to said output of said preamplifier network, a gain controller coupled between said input and output legs of said amplifier, said gain controller being responsive to a gain control signal to permit continuous gain adjustment of said amplifier, and a gain control circuit having an input coupled to said amplifier output and output coupled to said gain controller, said gain control circuit for comparing an output voltage on said amplifier output with a predetermined threshold signal and for generating said gain control signal on said gain control circuit output so as to provide continuous gain adjustment of said amplifier at least when said amplifier output signal is greater than said predetermined threshold signal; and an output drive network having an input connected to said output of said preamplifier network and an output connected to a sound transducer, said output drive network including an amplifier having a fixed gain, wherein said preamplifier network gain control circuit includes:
  a rectifier circuit portion having an input coupled to said output of said amplifier and an output, said output of said rectifier circuit portion providing a rectified voltage;
  a voltage comparing circuit portion receiving said rectified voltage and said predetermined threshold voltage and generating an output signal that is a difference between said rectified voltage and said predetermined threshold voltage;
  a summing circuit portion having a first input coupled to said output of said voltage comparing circuit portion and a second input coupled to a sub-threshold amplifier, said summing circuit portion generating an output signal that is a sum of the signals on said first and second inputs; and
  a current generating circuit portion having an input coupled to said output of said summing circuit and an output coupled to said gain controller, said current generating circuit generating a gain control current that is proportional to said rectified voltage and said predetermined threshold voltage.

13. The hearing aid according to claim 12, wherein said predetermined threshold signal for said hearing aid is a voltage set to a value below a voltage where said preamplifier network amplifier saturates.

14. The hearing aid according to claim 13, wherein said predetermined threshold voltage ranges from between about 7.8 mV (rms) and about 880 mV (rms).

15. The hearing aid according to claim 12, wherein said gain control current is defined by:

$$I_{cm} = I_{st} \left[ \frac{|V_o|}{V_{th}} \right]^{GT}$$

16. The hearing aid according to claim 12, wherein said gain control circuit includes means for selectively controlling said gain control signal such that when a signal level on said amplifier output exceeds a signal level of said predetermined threshold signal said gain control signal is generated on said gain control circuit output.

17. A hearing aid comprising:
  a preamplifier network having an input connected to a sound detector and an output; and
  an output drive network having an input connected to said output of said preamplifier network and an output connected to a sound transducer, said output drive network including a compression amplifier having an amplifier with an input leg and an output leg corresponding to said output drive network output, a gain controller coupled between said input and output legs of said output drive network amplifier, said gain controller being responsive to a gain control signal for providing continuous gain adjustment of said output drive network amplifier, and a gain control circuit having an input coupled to said output drive amplifier output and output coupled to said gain controlling device, said gain control circuit for comparing an output voltage on said output drive network amplifier output with a predetermined threshold signal and for generating said gain control signal on said gain control circuit output so as to provide continuous gain adjustment of said output network amplifier at least when said output drive network amplifier output signal is greater than said predetermined threshold signal, wherein said output drive network gain control circuit includes:
  a rectifier circuit portion having an input coupled to said output of said output drive network amplifier and an output, said output of said rectifier circuit portion providing a rectified voltage;
  a voltage comparing circuit portion receiving said rectified voltage and said predetermined threshold voltage and generating an output signal that is a difference between said rectified voltage and said predetermined threshold voltage;
  a summing circuit portion having a first input coupled to said output of said voltage comparing circuit portion and a second input coupled to a sub-threshold amplifier, said summing circuit portion generating an output signal that is a sum of the signals on said first and second inputs; and
  a current generating circuit portion having an input coupled to said output of said summing circuit and an output coupled to said gain controller, said current generating circuit generating a gain control current that is proportional to said rectified voltage and said predetermined threshold voltage.

18. The hearing aid according to claim 17, wherein said predetermined threshold signal for said hearing aid is a voltage set to a value below a voltage where said preamplifier network amplifier saturates.

19. The hearing aid according to claim 18, wherein said predetermined threshold voltage ranges from between about 7.8 mV (rms) and about 880 mV (rms).

20. The hearing aid according to claim 17, wherein said gain control current is defined by:

$$I_{cm} = I_{st} \left[ \frac{|V_o|}{V_{th}} \right]^{GT}.$$

21. The hearing aid according to claim 20, wherein said gain control current is about 1 µA.

22. The hearing aid according to claim 17, wherein said gain control circuit includes means for selectively controlling said gain control signal such that when a signal level on said amplifier output exceeds a predetermined threshold signal level said gain control signal is generated on said gain control circuit output.

* * * * *